(12) United States Patent
Sridhar et al.

(10) Patent No.: US 8,324,319 B2
(45) Date of Patent: Dec. 4, 2012

(54) REDOX-INDUCED CATIONICALLY POLYMERIZABLE COMPOSITIONS WITH LOW CURE TEMPERATURE

(76) Inventors: Laxmisha M. Sridhar, Monmouth Junction, NJ (US); Osama M. Musa, Hillsborough, NJ (US)

( * ) Notice: Subject to any disclaimer, the term of this patent is extended or adjusted under 35 U.S.C. 154(b) by 107 days.

(21) Appl. No.: 12/777,351

(22) Filed: May 11, 2010

(65) Prior Publication Data

US 2010/0222512 A1 Sep. 2, 2010

Related U.S. Application Data

(63) Continuation of application No. PCT/US2007/085272, filed on Nov. 20, 2007.

(51) Int. Cl.
C08L 63/00 (2006.01)
C08L 87/00 (2006.01)

(52) U.S. Cl. ........ 525/186; 525/107; 525/117; 525/120; 525/123; 525/165; 525/175; 525/176; 525/206; 525/217; 525/218; 525/241

(58) Field of Classification Search .................. None
See application file for complete search history.

(56) References Cited

U.S. PATENT DOCUMENTS

| | | | |
|---|---|---|---|
| 4,225,691 A | 9/1980 | Crivello | |
| 4,230,814 A * | 10/1980 | Crivello | 526/333 |
| 4,238,587 A | 12/1980 | Crivello | |
| 4,275,190 A | 6/1981 | Dudgeon | |
| 6,300,456 B1 | 10/2001 | Musa | |
| 6,307,001 B1 | 10/2001 | Musa | |
| 6,372,350 B1 | 4/2002 | Scott et al. | |
| 6,441,121 B1 | 8/2002 | Musa et al. | |
| 6,441,213 B1 | 8/2002 | Musa et al. | |
| 6,498,200 B1 * | 12/2002 | Suzuki et al. | 522/13 |
| 6,570,032 B1 | 5/2003 | Musa | |
| 6,716,992 B2 | 4/2004 | Musa | |
| 6,753,434 B1 | 6/2004 | Musa | |
| 6,803,406 B2 | 10/2004 | Musa | |
| 6,805,439 B2 | 10/2004 | Maeda et al. | |
| 6,809,155 B2 | 10/2004 | Musa | |
| 6,908,957 B2 | 6/2005 | Musa et al. | |
| 6,908,969 B2 | 6/2005 | Musa | |
| 6,929,863 B2 | 8/2005 | Frances | |
| 6,943,258 B2 | 9/2005 | Musa | |
| 6,953,862 B2 | 10/2005 | Musa | |
| 6,982,338 B2 | 1/2006 | Musa | |
| 7,034,064 B2 | 4/2006 | Musa | |
| 7,244,773 B2 * | 7/2007 | Sasa | 522/168 |
| 7,365,106 B2 * | 4/2008 | Suzuki et al. | 522/168 |
| 7,709,553 B2 | 5/2010 | Ito et al. | |
| 2006/0222832 A1 * | 10/2006 | Shimohara | 428/195.1 |

FOREIGN PATENT DOCUMENTS

| | | | |
|---|---|---|---|
| JP | 8-218296 A | * | 8/1996 |
| WO | 9833645 A1 | | 8/1998 |
| WO | 2005037876 A1 | | 4/2005 |

OTHER PUBLICATIONS

Toagosei technical information bulletin, "Aron Oxetane," 2011, 19 pages.*
Crivello, J. V. et al. "Redox-initiated cationic polymerization: The diaryliodonium salt/benzoin redox couple," Journal of Polymer Science: Polymer Edition, John Wiley & Sons, Inc., vol. 21, No. 4, Apr. 1983, pp. 1097-1110.

* cited by examiner

*Primary Examiner* — Robert Sellers
(74) *Attorney, Agent, or Firm* — Jane E. Gennaro

(57) ABSTRACT

A cationically polymerizable composition comprising (i) a cationically polymerizable resin, (ii) an onium salt, (iii) an azo or peroxide initiator, exhibits a lower cure temperature upon the addition of (iv) a catalytic or substoichiometric amount of an electron-rich vinyl resin to the reaction.

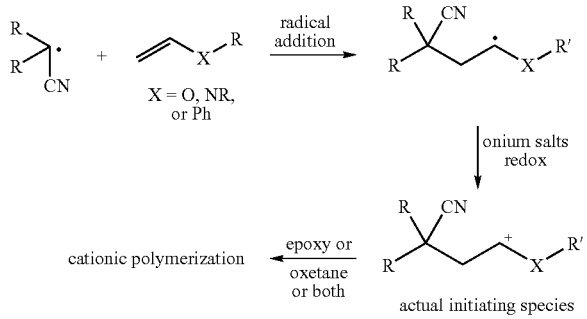

8 Claims, No Drawings

REDOX-INDUCED CATIONICALLY POLYMERIZABLE COMPOSITIONS WITH LOW CURE TEMPERATURE

CROSS-REFERENCE TO RELATED APPLICATION

This application is a continuation of International Application No. PCT/US2007/085272 filed Nov. 20, 2007, the contents of which is incorporated herein by reference.

BACKGROUND OF THE INVENTION

This invention relates to a redox-induced cationically polymerizable composition that exhibits reduced cure temperature and to a method for reducing the cure temperature of a cationically polymerizable composition.

In many manufacturing processes, processing speed leads to higher throughput and lower assembly costs. When the use of an adhesive, coating, or encapsulant is part of the manufacturing process, processing speed can be increased if the adhesive, coating, or encapsulant can be cured quickly at a relatively low curing temperature.

In the electronics packaging industry, for example, low temperature, fast (snap) cure adhesives and encapsulants are desired for various applications. A common mode of electronic packaging involves affixing semiconductor devices onto substrates by means of an adhesive or encapsulant. The more prominent uses are the bonding of integrated circuit chips to metal lead frames or organic substrates, and the bonding of circuit packages or assemblies to printed wire boards, including, for example, die attach for array package, die attach for RFID package, and component attach for ink jet cartridge assembly. For ink jet cartridge, low temperature cure assembly can minimize jetting trajectory distortion and improve printing quality. For temperature-sensitive components or substrates, such as, the paper-based antenna in RFID application and camera sensor in organic substrates, low temperature interconnect is very desirable. Thus, there is a need for polymerizable compositions that cure at low temperatures, preferably less than 100° C.

SUMMARY OF THE INVENTION

This invention is a polymerizable composition comprising (i) a cationically polymerizable resin, (ii) an onium salt, (iii) an azo or peroxide initiator, and (iv) an electron-rich vinyl resin.

In another embodiment, this invention is a polymerizable composition comprising (i) a cationically polymerizable resin, (ii) an onium salt, (iii) an azo or peroxide initiator, and (iv) a catalytic or substoichiometric amount of an electron-rich vinyl resin.

In another embodiment, this invention is method for reducing the cure temperature of a cationically polymerizable resin, in which the cure of the resin is catalyzed by the addition of an onium salt and an azo or peroxide initiator to the resin, the method comprising adding an electron-rich vinyl resin to the mixture of resin, onium salt and azo or peroxide initiator.

In another embodiment, this invention is method for reducing the cure temperature of a cationically polymerizable resin, in which the cure of the resin is catalyzed by the addition of an onium salt and an azo or peroxide initiator to the resin, the method comprising adding a catalytic or substoichiometric amount of an electron-rich vinyl resin to the mixture of resin, onium salt and azo or peroxide initiator.

DETAILED DESCRIPTION OF THE INVENTION

The reaction scheme for the cationic polymerization using onium salt and an azo initiator, in the presence of an electron-rich vinyl species, occurs as depicted here:

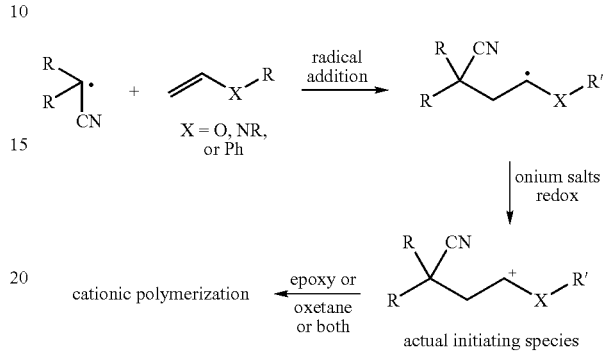

in which R and R' are any organic moiety.

Peroxide can also be used to generate a radical for reaction with the onium salt.

As used within this specification and claims, a curable resin is one that is polymerizable with or without crosslinking. Curable and polymerizable are used interchangeably and a cationically curable resin or composition is one that is polymerizable. Any cationically polymerizable resin may be used in the above reaction. Exemplary cationically polymerizable resins include oxetanes, epoxies, spiroorthocarbonates, spiroorthoesters, and benzoxazines, or a mixture of any of those.

Suitable oxetane resins are those disclosed in U.S. Pat. Nos. 7,034,064, 6,982,338, 6,953,862, 6,943,258, 6,753,434, and those available from Toagosei Corporation under the tradenames OXT-221, OXT-121, OXT-101, OXT-212, OXT-211, CHOX, OX-SC, PNOX-1009, having the structures:

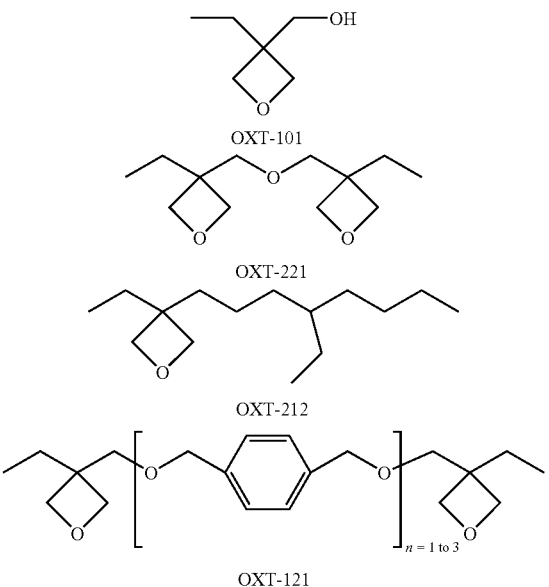

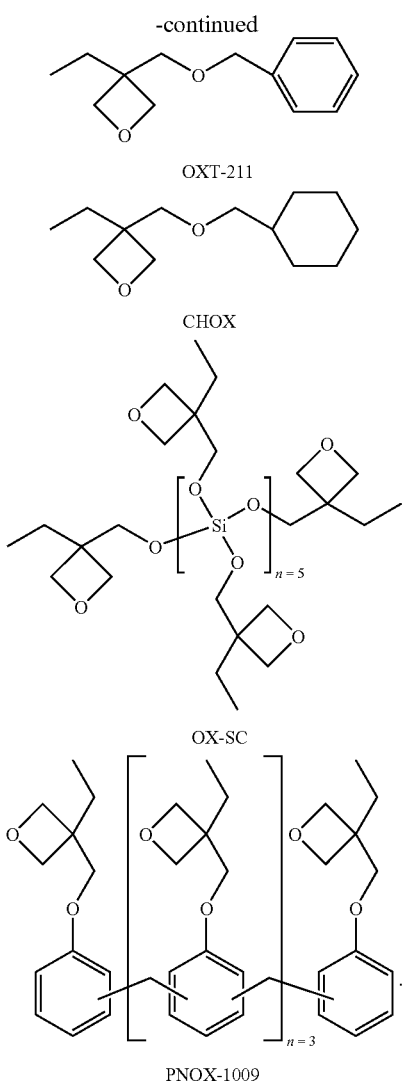

OXT-211

CHOX

OX-SC

PNOX-1009

Suitable epoxy resins include bisphenol epoxies, naphthalene epoxies, and aliphatic type epoxies. Commercially available materials include bisphenol type epoxy resins (for example, those sold under the tradenames EPICLON 830LVP, 830CRP, 835LV, 850CRP, available from Dainippon Ink & Chemicals, Inc.); naphthalene type epoxy resins (for example, those sold under the tradenames EPICLON HP4032, available from Dainippon Ink & Chemicals, Inc.); aliphatic epoxy resins (for example, those sold under the tradenames ARALDITE CY179, 184, 192, 175, 179, available from Ciba Specialty Chemicals; EPOXY 1234, 249, 206, available from Dow Corporation; and EHPE-3150, available from Daicel Chemical Industries, Ltd.)

Other suitable epoxy resins include cycloaliphatic epoxy resins, for example, 3,4-epoxy-cyclohexylmethyl 3,4-epoxy-cyclohexanecarboxylate, available as ERL-4221 from Union carbide and ARALDITE CY-179, available from Ciba-Geigy; diglycidylester of hexahydrophthalic anhydride, available as CY-184 from Ciba-Geigy; bis(3,4-epoxycyclohexylmethyl)-adipate, available as ERL-4229 from Union carbide; and other bisphenol-A type epoxy resins, bisphenol-F type epoxy resins, epoxy novolac resins, biphenyl type epoxy resins, naphthalene type epoxy resins, and dicyclopentadienephenol type epoxy resins, all commercially available from different sources.

Exemplary spiroorthocarbonate and vinyl spiroorthocarbonates include those having the following structures:

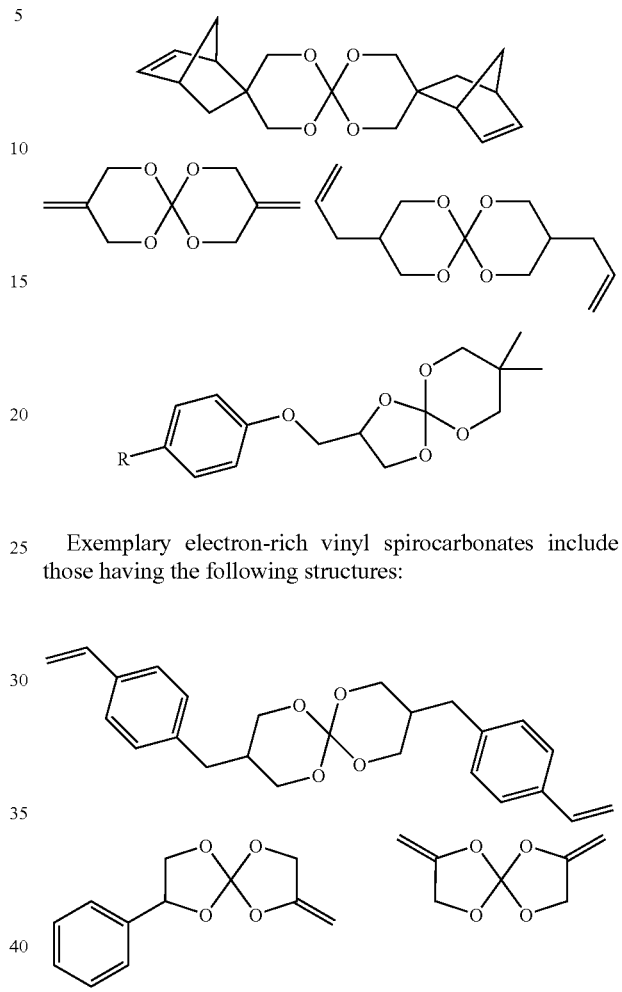

Exemplary electron-rich vinyl spirocarbonates include those having the following structures:

Exemplary spiroorthoesters include

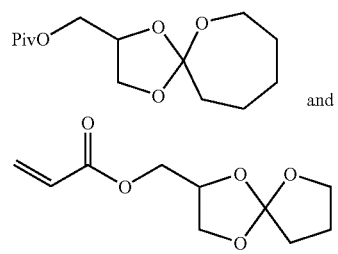

in which Piv is a trimethylacetyl group

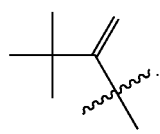

An exemplary electron-rich vinyl spiroorthoester is

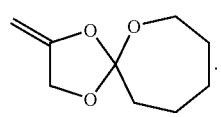

Suitable benzoxazines include those compounds containing the structure

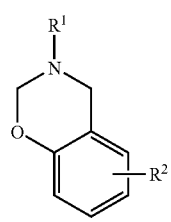

in which $R^1$ and $R^2$ are any organic moiety, including another benzoxazine structure.

Exemplary benzoxazine compounds include those of the formulae

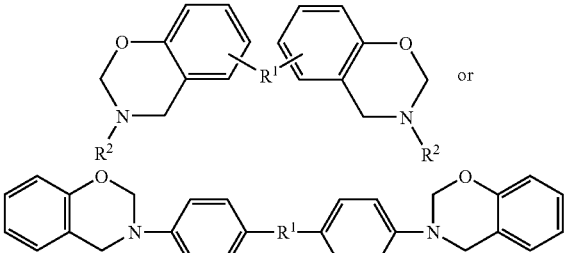

in which $R^1$ is a divalent radical that may be aliphatic, aromatic, or a combination of aliphatic and aromatic, and that may contain heteroatoms, such as oxygen, nitrogen, sulfur, phosphorous, or halogen, or that may be a single bond, or that may be $S$, $S_2$, $SO$, $SO_2$, $O$, or $CO$; and $R^2$ is hydrogen, an alkyl or substituted alkyl, an aromatic or substituted aromatic.

Specific suitable benzoxazine compounds include:

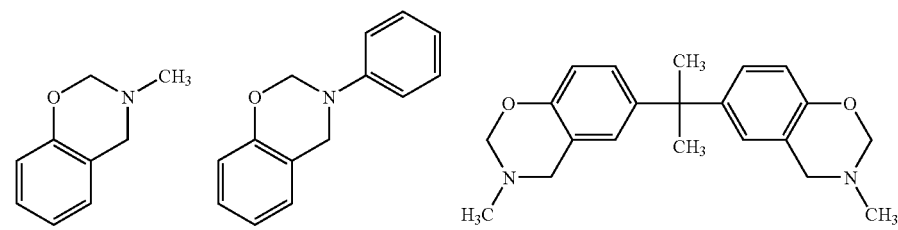

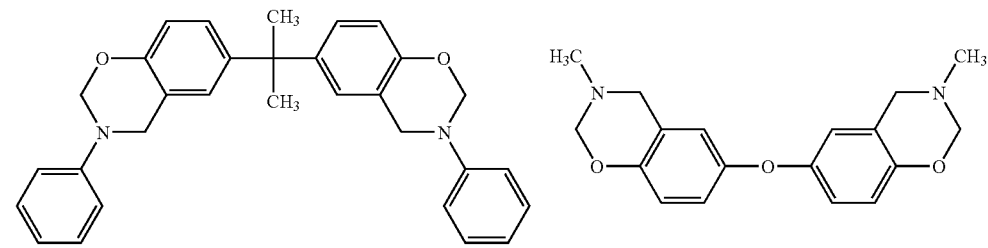

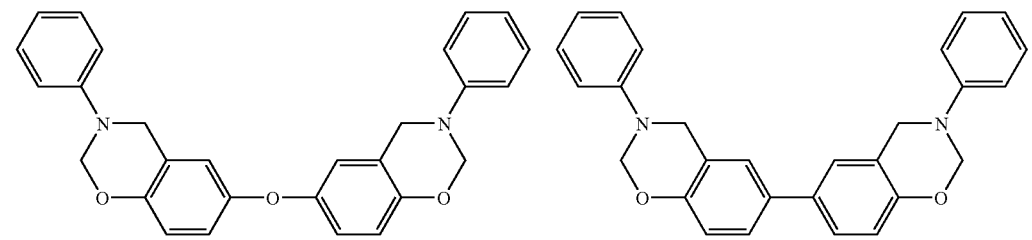

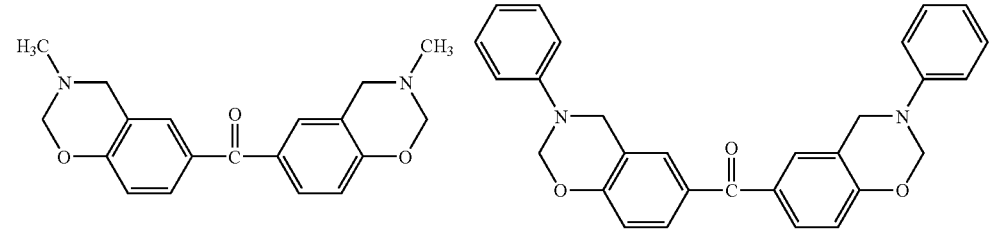

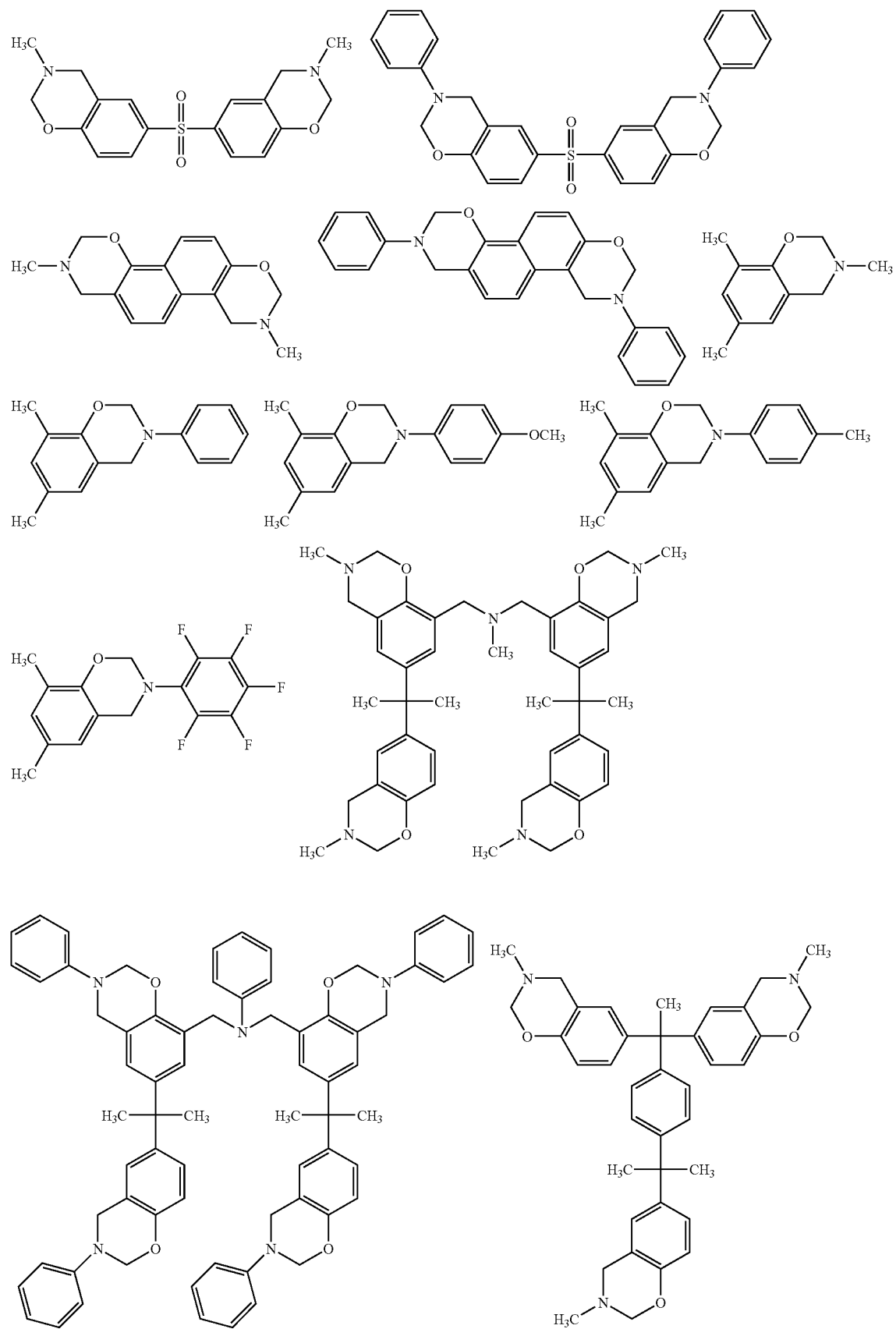

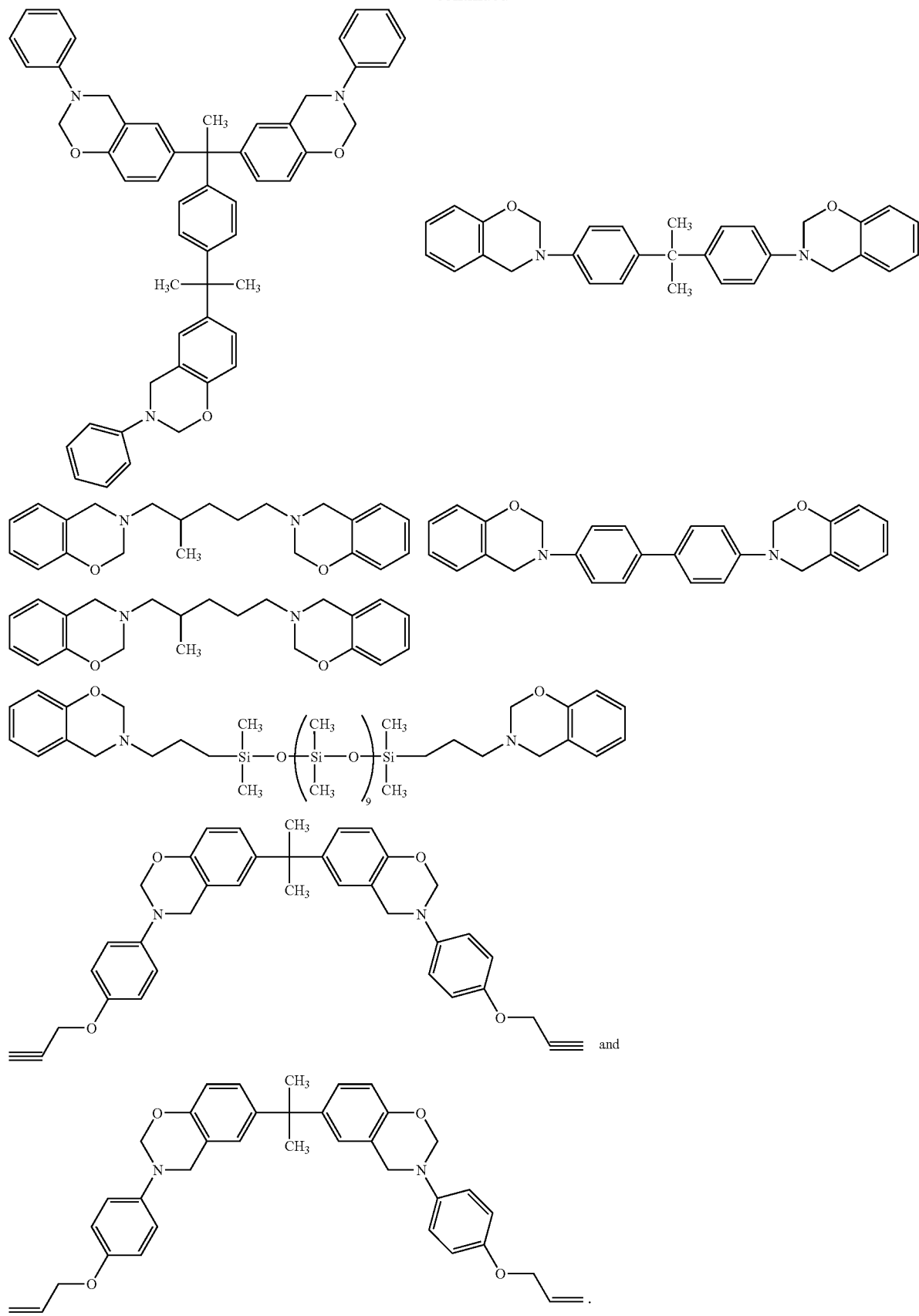

In addition to compounds such as the above, the benzoxazine may also be present in a polymeric species, such as depicted in the following structure:

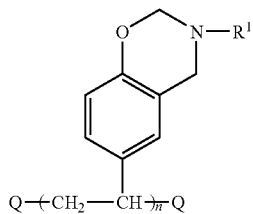

in which R¹ is as described above, n is an integer that will vary depending on the polymeric composition from which the benzoxazine depends, and each Q is a polymeric entity, for example, polyurethane, polyether, polyester, poly(butadiene) or polystyrenic.

Exemplary onium salts include iodonium salts, sulfonium salts, diazonium salts, ammonium salts or a mixture of those salts. In one embodiment, the onium salt is an iodonium salt of the formula

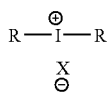

in which R is independently selected from phenyl, halophenyl, (for example, chlorophenyl) and $C_1$-$C_{20}$ alkylphenyl (for example, dodecyl phenyl). X is any suitable counter anion, for example, a halogen anion, $CF_3SO_3^-$, $C_6H_5SO_3^-$, $NO_3^-$, $AsF_6^-$, $SbF_6^-$, $FeCl_4^-$, $SbCl_6^-$, $BF_4^-$, $PF_6^-$, and $(C_6F_5)B^-$.

Commercially available iodonium salts include (p-Isopropylphenyl)(p-methylphenyl) iodonium tetrakis(pentafluorophenyl)borate from Gelest as RHODORSIL 2074, and bis-dodecyl phenyliodonium hexafluoroantimonate as UV 9380 from General Electric. The onium salts are used in an effective amount. In one embodiment, an effective amount is in the range of 0.1 to 10% by weight of the total resin.

Exemplary azo initiators include, for example, azoisobutylonitrile, 2,2'-azobispropane, 2,2'-azobis(2-methylbutanenitrile), and m,m'-azoxystyrene. Commercially available azo initiators are those available from Wako Specialty Company, such as those sold under the tradenames VA-044, VA-057, VA-085, V-70, VF-096, V-65, V-601, V-59, V-40, VF-096, V-30, and those available from Akzo Nobel, such as those sold under the tradenames PERKADOX ACCN, PERKADOX AIBN, PERKADOX AMBN-GR, and those available from Dupont, such as those sold under the tradenames VAZO-52, VAZO-64, VAZO-67 and VAZO-88. The azo initiators are used in an effective amount. In one embodiment an effective amount ranges from 0.1 to 10% by weight of the total resin content.

Exemplary peroxide initiators include those commercially available from Akzo Nobel, such as those sold under the tradenames PERKADOX and TRIGONOX. Other peroxide initiators are suitable, provided they generate radicals with the vinyl resin for reaction with the onium salt. Exemplary peroxides include benzoyl peroxide, lauroyl peroxide, octanoyl peroxide, butyl peroctoate, dicumyl peroxide, acetyl peroxide, para-chlorobenzoyl peroxide and di-t-butyl diperphthalate. The peroxide initiators are used in an effective amount. In one embodiment an effective amount ranges from 0.1 to 10% by weight of the total resin content.

Exemplary electron-rich vinyl resins include vinyl ethers, spirocyclic vinyl ethers, styrenics (compounds containing a styrene moiety), cinnamyls (in this specification and claims: compounds containing a cinnamyl moiety), N-vinylamides, and N-vinylamines.

Suitable vinyl ether resins include, for example, poly(butadienes), poly(carbonates), poly(urethanes), poly(ethers), poly(esters), simple hydrocarbons, and simple hydrocarbons containing functionalities such as carbonyl, carboxyl, amide, carbamate, urea, ester, or ether, which also contain vinyl ether functionality. Suitable commercially available vinyl ether resins include cyclohexane-dimethanol divinylether, dodecylvinylether, cyclohexyl vinylether, 2-ethylhexyl vinylether, dipropyleneglycol divinylether, hexanediol divinylether, octadecylvinylether, and butandiol divinylether, available from International Specialty Products (ISP); vinyl ethers sold under the tradenames VECTOMER 4010, 4020, 4030, 4040, 4051, 4210, 4220, 4230, 4060, 5015 available from Sigma-Aldrich, Inc.

Suitable spirocyclic vinyl ethers include, for example, those having the structures:

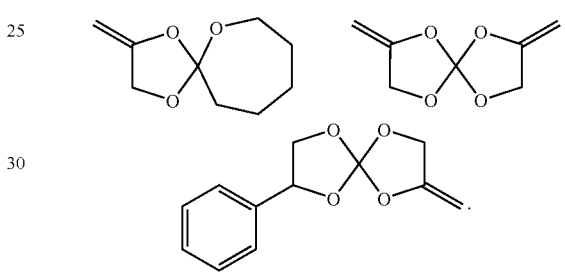

Suitable styrenic resins include, for example, those disclosed in U.S. Pat. Nos. 6,953,862, 6,908,969, 6,908,957, 6,809,155, 6,803,406, 6,716,992, 6,441,213, 6,441,121, 6,307,001, 6,300,456, and those commercially available styrene, substituted styrenics, divinyl benzene, diphenylethylene, and any other resins possessing styrenic functionality (hereinafter styrenics). Such resins can be, for example, polyesters, carbamates, ureas. Exemplary styrenic resins include compounds having the following structures in which R is an aliphatic or aromatic hydrocarbon, including those with heteroatoms.

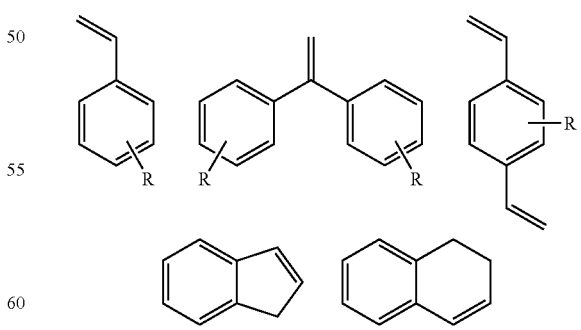

Suitable cinnamyl resins include, for example, those disclosed in U.S. Pat. Nos. 6,943,258, 6,753,434, 6,716,992, 6,908,969, 6,908,957, 6,809,155, 6,803,406, 6,753,434, 6,570,032, 6,441,121, 6,307,001, 6,300,456. The cinnamyl compounds can be any small molecule, oligomeric, or polymeric material that contains a cinnamyl functionality represented by the structural formula

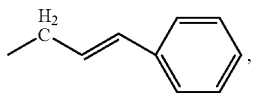

hereinafter, cinnamyls.

Suitable commercially available N-vinylamide resins include, for example, N-vinylpyrrolidone, N-vinylformamide, and N-vinylcaprolactone.

Suitable commercially available N-vinylamines include, for example, N-vinylcarbazole, N-vinylpyrrole, N-vinylimidazole, and 2-methyl-N-vinylimidazole.

In another embodiment, this invention is a method for polymerizing a cationically polymerizable composition of one or more cationically polymerizable monomers comprising reacting the cationically polymerizable composition in the presence of an onium salt, an azo or peroxide initiator, and an electron-rich vinyl resin. The components of such cationically polymerizable composition are as described earlier in this specification.

In another embodiment, this invention is a method for polymerizing a cationically polymerizable composition of one or more cationically polymerizable monomers comprising reacting the cationically polymerizable composition in the presence of an onium salt, an azo or peroxide initiator, and a catalytic or substoichiometric amount of an electron-rich vinyl resin. The components of such cationically polymerizable composition are as described earlier in this specification.

In another embodiment, this invention is a method for lowering the cure temperature of a cationically polymerizable composition comprising one or more cationically polymerizable monomers, an onium salt, and an azo or peroxide initiator, the method comprising adding to the cationically polymerizable composition an electron-rich vinyl resin. The components of such cationically polymerizable composition are as described earlier in this specification.

In another embodiment, this invention is a method for lowering the cure temperature of a cationically polymerizable composition comprising one or more cationically polymerizable monomers, an onium salt, and an azo or peroxide initiator, the method comprising adding to the cationically polymerizable composition a catalytic or substoichiometric amount of an electron-rich vinyl resin. The components of such cationically polymerizable composition are as described earlier in this specification.

In another embodiment, this invention is a two-part cationically polymerizable composition, one part comprising cationically polymerizable monomer and an onium salt, and the second part comprising cationically polymerizable monomer and an azo or peroxide initiator. Either the first part or the second part, or both, will contain an electron-rich vinyl resin. The components of these parts have been described earlier in this specification. The two parts may be mixed mechanically just before dispensing.

In another embodiment, this invention is a two-part cationically polymerizable composition, one part comprising cationically polymerizable monomer and an onium salt, and the second part comprising cationically polymerizable monomer and an azo or peroxide initiator. Either the first part or the second part, or both, will contain a catalytic or substoichiometric amount of an electron-rich vinyl resin. The components of these parts have been described earlier in this specification. The two parts may be mixed mechanically just before dispensing.

These two part polymerizations can occur simultaneously or independently, depending on the choice of specific azo or peroxide initiator and the temperature at which the initiator decomposes and forms the initiating radical species. Both the cationic polymerization of the cationic polymerizable materials and the radical polymerization of the vinyl monomers will occur below 100° C. with the appropriate choice of initiator.

In other embodiments, the polymerization of one or more cationically polymerizable monomers, in which the polymerization mix further comprises an onium salt, an azo or peroxide initiator, and an electron-rich vinyl resin, can be performed in the presence of one or more other vinyl monomers, such as, acrylates, methacrylates, maleimides, maleates, or fumarates, or a mixture of those (that is, vinyl monomers that are not typically denominated as electron-rich). In this polymerization, the azo or peroxide initiator will initiate the radical polymerization of these other vinyl monomers. The cationic polymerization of the cationic polymerizable materials and the radical polymerization of these vinyl monomers can occur simultaneously or independently, depending on the choice of specific azo or peroxide initiator and the temperature at which the initiator decomposes and forms the initiating radical species. In any case, the initiators can be chosen so that curing occurs at 100° C. or lower.

In other embodiments, the polymerization of one or more cationically polymerizable monomers, in which the polymerization mix further comprises an onium salt, an azo or peroxide initiator, and an electron-rich vinyl resin can be performed in the presence of a substoichiometric amount of one or more other vinyl monomers, such as, acrylates, methacrylates, maleimides, maleates, or fumarates, or a mixture of those. In this embodiment, the cationic polymerization is initiated by a cationic macroinitiator generated by radical polymerization and followed by oxidation as shown in the below reaction scheme. The two polymerization processes are dependent. To generate the macroinitiator, the electron-rich vinyl resin should be present in slight excess in comparison to the other vinyl resin. This embodiment works well in a two part system, in which one part contains the cationically polymerizable resin and the second contains the electron-rich vinyl resin and the other vinyl resin.

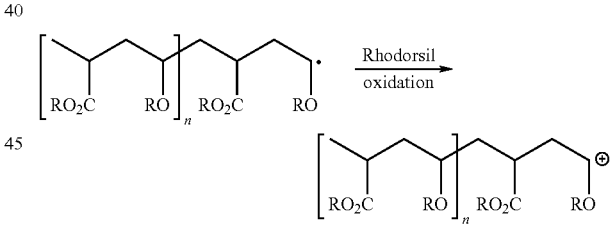

Suitable acrylate and methacrylate resins include those having the generic structure

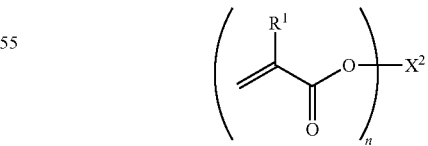

in which n is 1 to 6, $R^1$ is —H or —$CH_3$. and $X^2$ is an aromatic or aliphatic group. Exemplary $X^2$ entities include poly(butadienes), poly-(carbonates), poly(urethanes), poly(ethers), poly(esters), simple hydrocarbons, and simple hydrocarbons containing functionalities such as carbonyl, carboxyl, amide, carbamate, urea, ester, or ether. Commercially available materials include butyl(meth)acrylate, isobutyl(meth)acrylate, 2-ethyl hexyl (meth)acrylate, isodecyl(meth)acrylate, n-lauryl(meth)acrylate, alkyl(meth)-acrylate, tridecyl (meth) acrylate, n-stearyl(meth)acrylate, cyclohexyl(meth)-acrylate, tetrahydrofurfuryl(meth)acrylate, 2-phenoxy ethyl (meth)-acrylate, isobornyl(meth)acrylate, 1,4-butanediol di(meth)acrylate, 1,6-hexanediol di(meth)acrylate, 1,9-nonandiol di(meth)acrylate, perfluorooctylethyl(meth)acrylate, 1,10 decandiol di(meth)acrylate, nonylphenol polypropoxylate (meth)acrylate, and polypentoxylate tetrahydrofurfuryl acrylate, available from Kyoeisha Chemical Co., LTD; polybutadiene urethane dimethacrylate (CN302, NTX6513) and polybutadiene dimethacrylate (CN301, NTX6039, PRO6270) available from Sartomer Company, Inc; polycarbonate urethane diacrylate (ArtResin UN9200A) available from Negami Chemical Industries Co., LTD; acrylated aliphatic urethane oligomers (Ebecryl 230, 264, 265, 270, 284, 4830, 4833, 4834, 4835, 4866, 4881, 4883, 8402, 8800-20R, 8803, 8804) available from Radcure Specialities, Inc; polyester acrylate oligomers (Ebecryl 657, 770, 810, 830, 1657, 1810, 1830) available from Radcure Specialities, Inc.; and epoxy acrylate resins (CN104, 111, 112, 115, 116, 117, 118, 119, 120, 124, 136) available from Sartomer Company, Inc. In one embodiment the acrylate resins are selected from the group consisting of isobornyl acrylate, isobornyl methacrylate, lauryl acrylate, lauryl methacrylate, poly(butadiene) with acrylate functionality and poly(butadiene) with methacrylate functionality.

Suitable maleimide resins include those having the generic structure

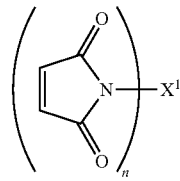

in which n is 1 to 3 and $X^1$ is an aliphatic or aromatic group. Exemplary $X^1$ entities include, poly(butadienes), poly(carbonates), poly(urethanes), poly(ethers), poly(esters), simple hydrocarbons, and simple hydrocarbons containing functionalities such as carbonyl, carboxyl, amide, carbamate, urea, ester, or ether. These types of resins are commercially available and can be obtained, for example, from Dainippon Ink and Chemical, Inc.

Additional suitable maleimide resins include, but are not limited to, solid aromatic bismaleimide (BMI) resins, particularly those having the structure

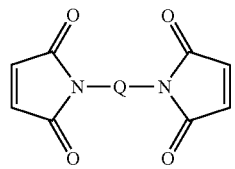

in which Q is an aromatic group. Suitable bismaleimide resins having aromatic bridging groups are commercially available, and can be obtained, for example, from Sartomer (USA) or HOS-Technic GmbH (Austria).

Other suitable maleimide resins include:

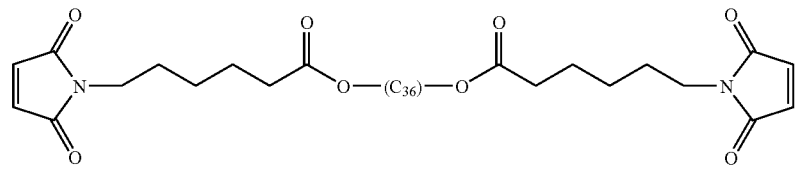

in which $C_{36}$ represents a linear or branched chain hydrocarbon chain (with or without cyclic moieties) of 36 carbon atoms;

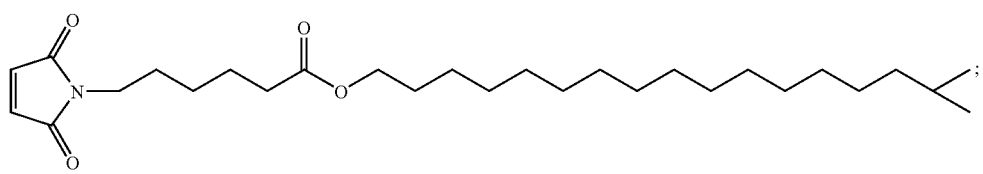

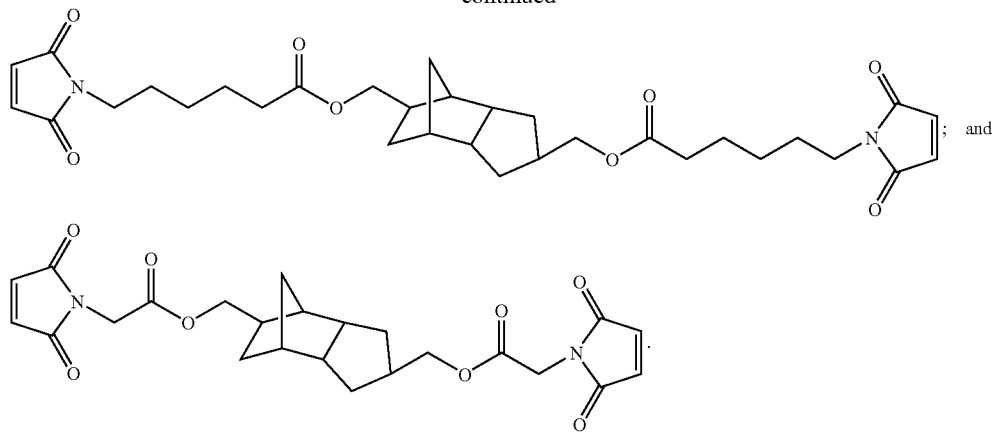

Suitable fumarates and maleates include, for example, dioctyl maleate, dibutyl maleate, dioctyl fumarate, and dibutyl fumarate.

In all embodiments, the cationically polymerizable composition may further comprise an additional monofunctional and/or polyfunctional cationically polymerizable resin, and/or a reactive cationically polymerizable diluent.

In all embodiments, the cationically polymerizable composition may further comprise a filler. Examples of suitable nonconductive fillers include alumina, aluminum hydroxide, silica, fused silica, fumed silica, vermiculite, mica, wollastonite, calcium carbonate, titania, sand, glass, barium sulfate, zirconium, carbon black, organic fillers, and halogenated ethylene polymers, such as, tetrafluoroethylene, trifluoroethylene, vinylidene fluoride, vinyl fluoride, vinylidene chloride, and vinyl chloride. Examples of suitable conductive fillers include carbon black, graphite, gold, silver, copper, platinum, palladium, nickel, aluminum, silicon carbide, boron nitride, diamond, and alumina.

The filler particles may be of any appropriate size ranging from nano size to several mm. Appropriate filler sizes can be determined by the practitioner, but, in general, will be within the range of 20 nanometers to 100 microns. The choice of such size for any particular end use is within the expertise of one skilled in the art. Filler may be present in any effective amount, and typically, an effective amount will range from 10 to 90% by weight of the total composition. More than one filler type may be used in a composition and the fillers may or may not be surface treated.

Other materials, such as adhesion promoters, dyes, pigments, and rheology modifiers, may be added as desired for modification of final properties. Such materials and the amounts needed are within the expertise of those skilled in the art.

In those cases in which the cationic polymerizable monomer is not an epoxy, the worklife of the composition can be lengthened by the addition of an epoxy resin or a radical inhibitor. As an additive to increase worklife, the epoxy resin will be present in an amount of 1 to 90% by weight of total resin. Suitable epoxy resins are those previously disclosed in this specification. In those cases in which a radical inhibitor is used to lengthen worklife, the radical inhibitor will be present in an amount of 10 ppm to 2000 ppm. Suitable radical inhibitors include, for example, hydroquinone, methylhydroquinone, t-butylcatechol, phenothiazine, and NPAL having the structure

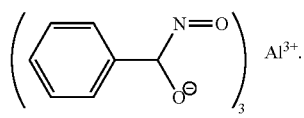

EXAMPLES

Example 1

Effect of Electron-Rich Vinyl Compound on Cure Temperature of Cationically Polymerizable Composition A cationically polymerizable composition was prepared as a control to contain oxetane (OXT-221) having the structure shown above in this specification, an iodonium salt (R$_{HODOR}$-$_{SIL}$-2074), and an azo initiator (V$_{AZO}$-52). Additional compositions were prepared to contain the control composition and a catalytic amount of vinyl ether I, vinyl ether II, or a styrene compound, having the structures shown below. Samples of the compositions were cured and their peak temperature (Tpeak) recorded. Other samples of the same composition were stored at room temperature and gel times recorded to measure worklife.

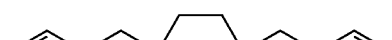

vinyl ether I

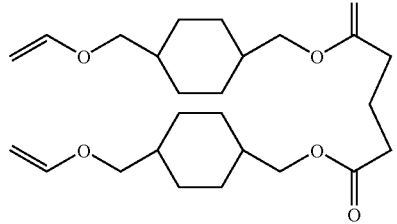

vinyl ether II

-continued

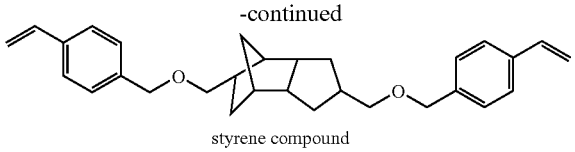

styrene compound

The formulations for the compositions and the results are reported in TABLE 1. The results show that the addition of vinyl ether to the cationically polymerizable oxetane in the presence of an iodonium salt and an azo initiator decreased the cure temperature of the composition (compare entry 1 control to entry 2). Increasing the amount of iodonium salt from 1 mol % to 2 mol % (entry 3) increased the gel time, without affecting the cure temperature. Vinyl ether alone had the lowest cure temperature, but had a short gel time (entry 5). The difunctional styrenic compound, another electron-rich vinyl compound, lowered the cure temperature similarly to the vinyl ether (entry 6). Isothermal Differential Scanning Calorimetry was run on two samples: the sample shown in entry 2 with a peak temperature of 76° C. cured in about 45 seconds at 85° C.; and the sample shown in entry 5 with a peak temperature of 65° C. cured in 30 seconds at 85° C.

TABLE 1

EFFECT OF VINYL ETHER ON CURE TEMPERATURE

| RESIN | REDOX SYSTEM | Tpeak | GEL TIME |
|---|---|---|---|
| 1. OXT-221 oxetane 1.45 g | iodonium salt (1 mol %) 69 mg azo initiator (1 wt %) 13 mg | 132° C. | 6 days |
| 2. OXT-221 oxetane 1.65 g Vinyl Ether I (0.2 mol eq) 0.300 g | iodonium salt (1 mol %) 78 mg azo initiator (1 wt %) 15 mg | 76° C. | 11 hours |
| 3. OXT-221 oxetane 2.00 g Vinyl Ether I (0.2 mol eq) 0.366 g | iodonium salt (2 mol %) 94 mg azo initiator (1 mol %) 18 mg | 77° C. | 12 hours |
| 4. OXT-221 oxetane 1.46 g | iodonium salt (2 wt %) 29 mg | 87° C. | not assessed |

TABLE 1-continued

EFFECT OF VINYL ETHER ON CURE TEMPERATURE

| RESIN | REDOX SYSTEM | Tpeak | GEL TIME |
|---|---|---|---|
| Vinyl Ether II (2.5 mol %) 0.071 g 5. Vinyl Ether II (vinyl ether alone) 2.00 g | azo initiator (1 mol %) 16 mg iodonium salt (1 wt %) 20 mg azo initiator (1 mol %) 11 mg | 65° C. | 4 hours |
| 6. OXT-221, oxetane 1.46 g Styrene 0.22 g (0.1 molar eq) | iodonium salt (2 wt %) 32 mg azo initiator (1 mol %) 17 mg | 97° C. | 3 days |

Example 2

Effect of Epoxy or Radical Inhibitor on Worklife of Cationically Polymerizable Composition In order to improve the worklife of the compositions, epoxy or a radical inhibitor was added to the formulations. A control cationically polymerizable composition was prepared to contain oxetane (OXT-221) having the structure shown above, an iodonium salt (RHODORSIL), an azo initiator (VAZO-52) and vinyl ether I or II having the structures shown above. To this was added epoxy resin or methylhydroquinone (MeHQ) as a radical inhibitor. The epoxy resins used were a cycloaliphatic epoxy sold under the tradename CYRACURE UVR6128 from Dow chemicals or epoxy resin sold under the tradename EPON 834 from Hexion chemicals.

The composition components and results are reported in TABLE 2 and show that the addition of epoxy to the composition stabilized the formulation and improved gel times (entries 2 and 3). The epoxy system without oxetane and a catalytic amount of vinyl ether showed a peak temperature of 95° C. with good work life (entry 4). Changing from vinyl ether I to vinyl ether II increased the gel time slightly (entry 5), indicating that the worklife may depend on the type of vinyl ether used. Use of radical inhibitors improved the work life of the formulations, although there was an accompanying increase in the peak temperature, which corresponded to the amount of inhibitor used (entries 6, 7, 8, 9).

TABLE 2

EFFECT OF EPOXY OR RADICAL INHIBITOR ON WORKLIFE

| RESIN | REDOX SYSTEM | PEAK TEMP | GEL TIME |
|---|---|---|---|
| 1. OXT-221 oxetane 1.65 g Vinyl Ether I (0.2 mol eq.) 0.30 g | iodonium Salt (1 mol %) 78 mg azo Initiator (1 mol %) 15 mg | 76° C. | 11 hours |
| 2. OXT-221 oxetane 1.35 g Vinyl Ether I (0.2 mol eq.) 0.25 g Epoxy CYRACURE (0.2 mol eq.) 0.46 g | iodonium salt (1 mol %) 64 mg azo initiator (1 mol %)15.6 mg | 77° C. | 20 hours |
| 3. OXT-221 oxetane 2.04 g, Vinyl Ether II (0.2 mol eq) 0.78 g Epoxy EPON 834 (50 wt %) 1.03 g | iodonium salt (2 wt %) 40 mg azo initiator (1 mol %) 23.6 mg | 84° C. | 2 days |
| 4. Epoxy CYRACURE 1.63 g Vinyl Ether I (0.2 mol eq.) 0.174 g | iodonium salt (1 mol %) 45 mg azo initiator (1 mol %) 8.5 mg | 95° C. | 4.5 days |
| 5. OXT-221 oxetane, Vinyl Ether II (0.2 molar eq.), Epoxy CYRACURE (0.2 mol eq.) | iodonium salt (1 mol %) azo initiator (1 mol %) | 80° C. | 1.5 day |
| 6. OXT-221 oxetane 1.35 g Vinyl Ether I (0.2 molar eq.) 0.247 g MeHQ (1000 ppm) 1.35 mg | iodonium salt (1 mol %) 64 mg azo initiator (1 mol %) 16 mg | 101° C. | 8 days |
| 7. OXT-221 oxetane 1.71 g Vinyl Ether I (0.2 molar eq) 0.313 g MeHQ (0.86 mg, 500 ppm) | iodonium salt (1 mol %) 81 mg azo initiator (1 mol %)20 mg | 96° C. | 8 days |
| 8. OXT-221 oxetane 1.43 g Vinyl Ether I (0.2 mol eq) 0.26 g MeHQ (0.29 mg, 200 ppm) | iodonium salt (1 mol %) 67 mg azo initiator (1 mol %)13 mg | 90° C. | 4.5 days |

TABLE 2-continued

EFFECT OF EPOXY OR RADICAL INHIBITOR ON WORKLIFE

| RESIN | REDOX SYSTEM | PEAK TEMP | GEL TIME |
|---|---|---|---|
| 9. OXT-221 oxetane 2.00 g, Vinyl Ether II (0.2 mol eq) 0.78 g Epoxy CYRACURE (0.68 g, 0.2 mol eq) MeHQ (0.05 mg, 50 ppm) | iodonium salt (2 wt %) azo initiator (1 mol %) | 85° C. | >1 day |

Example 3

Effect of Peroxide Initiator on the Cure Temperature of Cationically Polymerizable Compositions Azo initiators can liberate $N_2$ gas upon decomposition, which is undesirable in applications where low outgassing is required. The successful substitution of peroxides for the azo initiators will be dependent on the peroxide chosen. Cationically polymerizable compositions were prepared as in the previous examples with the substitution of benzoyl peroxide and a commercial peroxide sold under the tradename TRIGONOX-23 for the azo initiators. The formulations of the compositions and the results are reported in TABLE 3. The data show that the (TRIGONOX) peroxide was more effective than benzoyl peroxide as an initiator.

TABLE 3

EFFECT OF PEROXIDE INITIATOR ON CURE TEMPERATURE

| RESIN | REDOX SYSTEM | Tpeak | GELTIME |
|---|---|---|---|
| 1. OXT-221 oxetane 1.36 g | onium salt (1 mol %) 64 mg benzoyl peroxide (1 mol %) 15 mg | 107° C. | not assessed |
| 2. OXT-221 oxetane 1.34 g Vinyl Ether I (0.2 eq) 0.24 g | onium salt (1 mol %) 64 mg benzoyl peroxide (1 mol %) 15 mg | 104° C. | not assessed |
| 3. OXT-221 oxetane 1.28 g Vinyl Ether II (0.2 eq) 0.52 g | onium salt (2 w %) 26 mg Trigonox-23 (2 w %) 20 mg | 69° C. | 11 hours |

What is claimed:

1. A polymerizable composition comprising (i) a cationically polymerizable resin selected from the group consisting of spiroorthocarbonates, spiroorthoesters, and benzoxazines, or a mixture of any of those, (ii) an onium salt, (iii) an azo or peroxide initiator, and (iv) an electron-rich vinyl resin.

2. The polymerizable composition according to claim 1 in which the electron-rich vinyl resin is selected from the group consisting of vinyl ethers, spirocyclic vinyl ethers, styrenics, cinnamyls, N-vinylamides, and N-vinylamines.

3. The polymerizable composition according to claim 1 in which the electron-rich vinyl resin in present in a catalytic or substoichiometric amount.

4. The polymerizable composition according to claim 3 in which the electron-rich vinyl resin is selected from the group consisting of vinyl ethers, spirocyclic vinyl ethers, styrenics, cinnamyls, N-vinylamides, and N-vinylamines.

5. A method for lowering the cure temperature of a cationically polymerizable composition comprising (i) a cationically polymerizable resin selected from the group consisting of spiroorthocarbonates, spiroorthoesters, and benzoxazines, or a mixture of any of those, (ii) an onium salt, (iii) an azo or peroxide initiator, the method comprising reacting the cationically polymerizable composition in the presence of (iv) an electron-rich vinyl resin.

6. The method according to claim 5 in which the electron-rich vinyl resin is selected from the group consisting of vinyl ethers, spirocyclic vinyl ethers, styrenics, cinnamyls, N-vinylamides, and N-vinylamines.

7. The method according to claim 5 in which the electron-rich vinyl resin in present in a catalytic or substoichiometric amount.

8. The method according to claim 7 in which the electron-rich vinyl resin is selected from the group consisting of vinyl ethers, spirocyclic vinyl ethers, styrenics, cinnamyls, N-vinylamides, and N-vinylamines.

* * * * *